United States Patent [19]
Thakur et al.

[11] Patent Number: 5,382,551
[45] Date of Patent: Jan. 17, 1995

[54] METHOD FOR REDUCING THE EFFECTS OF SEMICONDUCTOR SUBSTRATE DEFORMITIES

[75] Inventor: Randhir P.S. Thakur, Annette L. Martin, both of Boise, Id.

[73] Assignee: Micron Semiconductor, Inc., Boise, Id.

[21] Appl. No.: 45,398

[22] Filed: Apr. 9, 1993

[51] Int. Cl.⁶ .................. H01L 21/324; H01L 21/477
[52] U.S. Cl. ............................................. 437/247
[58] Field of Search .............. 437/247, 249, 974, 976

[56] References Cited

U.S. PATENT DOCUMENTS

| | | | |
|---|---|---|---|
| 4,017,341 | 4/1977 | Suzuki et al. | 437/974 |
| 4,581,814 | 4/1986 | Celler et al. | 437/247 |
| 5,019,529 | 5/1991 | Takasaki | 437/976 |
| 5,071,785 | 12/1991 | Nakazato et al. | 437/976 |
| 5,124,561 | 6/1992 | Faure et al. | 250/505.1 |
| 5,226,403 | 7/1993 | Toyama | 125/13.01 |
| 5,230,184 | 7/1993 | Bukhman | 51/283 R |
| 5,234,867 | 8/1993 | Schultz et al. | 156/636 |

FOREIGN PATENT DOCUMENTS

| | | | |
|---|---|---|---|
| 59-63738 | 4/1984 | Japan | 437/976 |
| 2-58329 | 2/1990 | Japan | 437/974 |

*Primary Examiner*—Tom Thomas
*Assistant Examiner*—Lynne A. Gurley
*Attorney, Agent, or Firm*—Lia M. Pappas

[57] ABSTRACT

A method is disclosed for reducing the effects of semiconductor deformities. Initially, a semiconductor substrate is provided. The substrate has at least one layer superjacent the substrate and at least one layer subjacent the substrate. Subsequently, the semiconductor structure is examined for warp and bow type deformities. As a result of this examination, the warp and bow measurements of the semiconductor structure are compared with a reference. In the event that the measured warp and bow exceed a predetermined tolerance, either the thickness of the layer superjacent or the thickness of the layer subjacent is reduced. This reducing step can be accomplished by chemical and/or mechanical planarization, dry etching, wet etching or plasma etching.

20 Claims, 5 Drawing Sheets

METHOD FOR REDUCING THE EFFECTS OF SEMICONDUCTOR SUBSTRATE DEFORMITIES

FIELD OF THE INVENTION

The present invention relates to a method for fabricating semiconductors. More particularly, the invention pertains to a method for reducing the effects of semiconductor deformities.

BACKGROUND OF THE INVENTION

Single wafer Rapid Thermal Processing ("RTP") is emerging as a technique of choice in the fabrication of advanced sub-half micron memory devices. This is primarily because RTP enables wafers to be heated rapidly at high temperatures using a controlled source. Nonetheless, high temperature processing methods for large diameter semiconductor wafers, such as RTP for example, as well as methods employing a furnace through a complete CMOS flow, have not eliminated the issue of thermal stress. Also, furnace annealing of wafers with high oxygen precipitation may substantially warp and/or bow during subsequent patterning and multi-step processing.

Transient heating techniques, such as laser annealing and RTP, are essentially non-equilibrium processes. In that light, large diameter silicon wafers typically warp and bow as a result of being subjected to high temperature or high stress films. This issue is founded on the non-uniform distribution of heat over the wafer. Uniformly exposed to a high temperature, the wafer's edges reach a substantially different temperature from the center of the wafer, as well as from themselves. These differences in temperature between center of the wafer and its edges create a thermal stress over the wafer. At high temperature, this induced stress results in plastic deformation of the wafer, particularly where it exceeds the elastic limit of the silicon wafer itself.

As a byproduct of thermal stress, high stress film deposition and patterning, a wafer will warp and bow where its elastic limit has been surpassed. FIGS. 1(a)–(g) and 2 illustrate the many different structural configurations of a deformed wafer. In view of these illustrations, it should be obvious to one of ordinary skill in the art that a semiconductor substrate can deform, by means of warping and bowing, in a variety of ways.

Referring to FIG. 3, a system for measuring the warp and bow of a semiconductor substrate is illustrated. The system employs two probes, Probe A and Probe B, for measuring the warpage of a semiconductor substrate 5. Probe A is positioned in association with the top portion of substrate 5, while Probe B is positioned in association with the bottom portion of substrate 5. By properly realizing the system of FIG. 3, the warp and bow of a semiconductor structure can be mathematically deduced. Bow can be expressed by the following equation:

$$Bow = (\tfrac{1}{2}) * (Peak - Base).$$

In light of FIG. 3, warp can be defined by the following formula:

$$Warp = (\tfrac{1}{2}) * [(b-a)max - (b-a)min]$$

where $a$ = distance between Probe A and the substrate's top surface;

$b$ = distance between Probe B and the substrate's bottom surface;

max = maximum difference between "b" and "a" over the wafer; and min = minimum difference between "b" and "a" over the wafer.

The phenomenon of warp and bow typically results in the dislocation, slippage and gross mechanical instability of the wafer. These side effects of thermal stress can ultimately lead to loss of device yield, dielectric defects, as well as reduced photolithographic yield. The loss of photolithographic yield is in part attributable to the degradation of wafer uniformity and flatness. Moreover, the loss of geometrical planarity of wafer is due to warp and bow, which in turn, substantially impacts the feasibility of processing a wafer, or leads to self-fracture of the wafer.

Both intrinsic and extrinsic stresses of the wafer, localized in a specific area or uniformly spread across its topography, impact on the flatness of the wafer. The wafer level distortion, in the form of a curve or pattern movement, translates into more stringent critical dimensions and overlay requirements at lithography step level.

The phenomena of wafer warp and bow is further magnified in high density, sub-half micron devices because of their reliance on multilayer heterostructure formations. Each layer in these devices is typically associated with a different thermal expansion coefficient. Further, several masking steps are required to fabricate each layer, thus compounding misalignment issues in the event of warp and/or bow type deformities. FIG. 4(a) illustrates, from a cross sectional perspective, a properly aligned semiconductor substrate. In contrast, FIG. 4(b) depicts a misaligned semiconductor substrate from the same perspective. Thus, steady state exposure to high temperatures over a long period of time due to the effects of thermal stress and encourage excessive warp and bow, loss of geometric planarity and any further process venture may even break the wafer.

Thus, in light of the potential harm of warp and bow, a method is needed to reducing the effects of semiconductor substrate deformities.

SUMMARY OF THE INVENTION

It is the primary object of the present invention is to eliminate the aforementioned drawbacks of the prior art.

Another object of the present invention to provide a method for fabricating semiconductors which reduces the effects of semiconductor structural deformities.

It is further object of the present invention to provide a method for fabricating semiconductors which overcome the effects of warp and bow in the manufacture of semiconductor devices.

In order to achieve these hereinabove objects, as well as others which will become apparent hereafter, a method is disclosed for reducing the effects of semiconductor substrate deformities. Initially, a semiconductor substrate is provided. The substrate comprises at least one layer superjacent the substrate and at least one layer subjacent the substrate. Subsequently, the substrate is examined for warp and bow. As a result of this examination, the warp and bow of the substrate are compared with a reference. In the event that the measured warp and bow exceed a predetermined tolerance, either the thickness of the layer superjacent or the thickness of the layer subjacent is reduced. This reducing step can be accomplished by chemical and/or mechanical planarization, dry etching, wet etching, plasma etching or any other technique known to one of ordinary skill in the art.

In an alternate embodiment, a film is formed either superjacent or subjacent to provide support during a heating step. The film is formed in order to provide temporary support during the fabrication stages for which substrate is heated and thus vulnerable to plastic deformation. Once it has performed its function as a stabilizer, it is removed. The removal of film can be achieved by chemical and/or mechanical planarization, dry etching, wet etching, plasma etching or other techniques known to one of ordinary skill in the art.

Other objects and advantages will become apparent to those skilled in the art from the following detailed description read in conjunction with the appended claims and the drawings attached hereto.

BRIEF DESCRIPTION OF DRAWINGS

The present invention will be better understood from reading the following description of non-limitative embodiments, with reference to the attached drawings, wherein below:

FIG. 4(a) is a cross sectional view of a properly aligned semiconductor structure, while

It should be emphasized that the drawings of the instant application are not to scale but are merely schematic representations and are not intended to portray the specific parameters or the structural details of the invention, which can be determined by one of skill in the art by examination of the information herein.

DETAILED DESCRIPTION OF THE INVENTION

Figure 1A:
FIGS. 1(a)-(g) are cross sectional stylized views of a warped semiconductor structure.
Figure 1B:
Figure 1C:
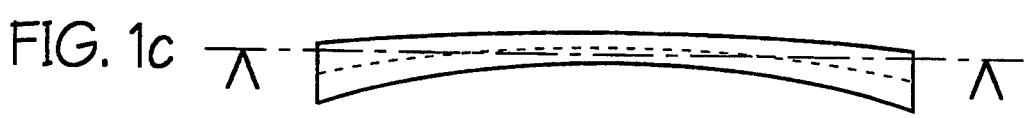
Figure 1D:
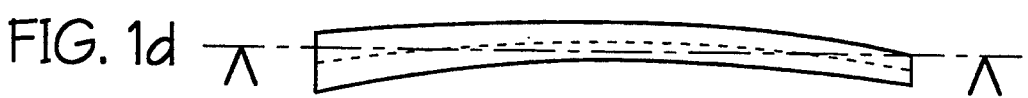
Figure 1E:
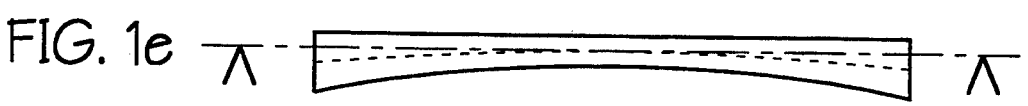
Figure 1F:
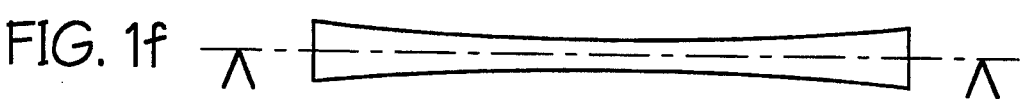
Figure 1G:
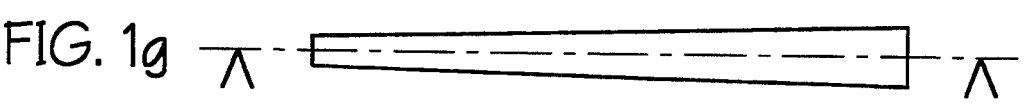
Figure 2:
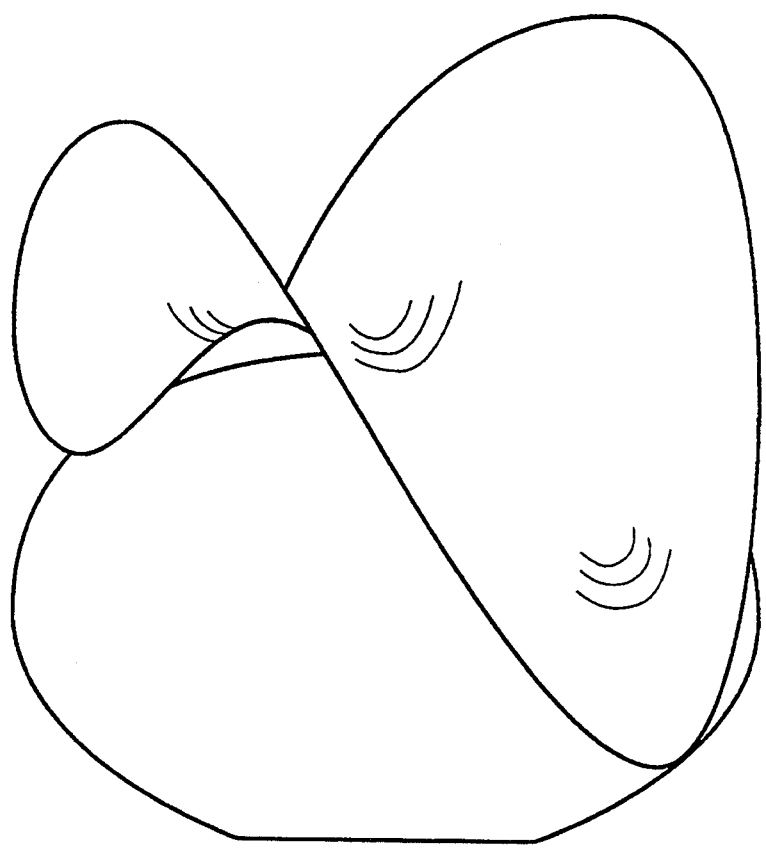
FIG. 2 is a three dimensional view of a warped semiconductor structure.
Figure 3:
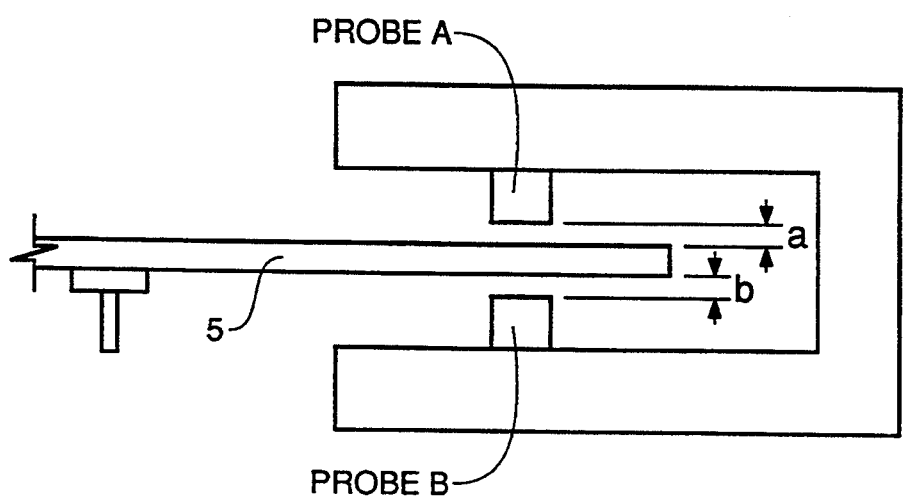
FIG. 3 is a system for measuring the warp and bow of a semiconductor structure.
Figure 4A:
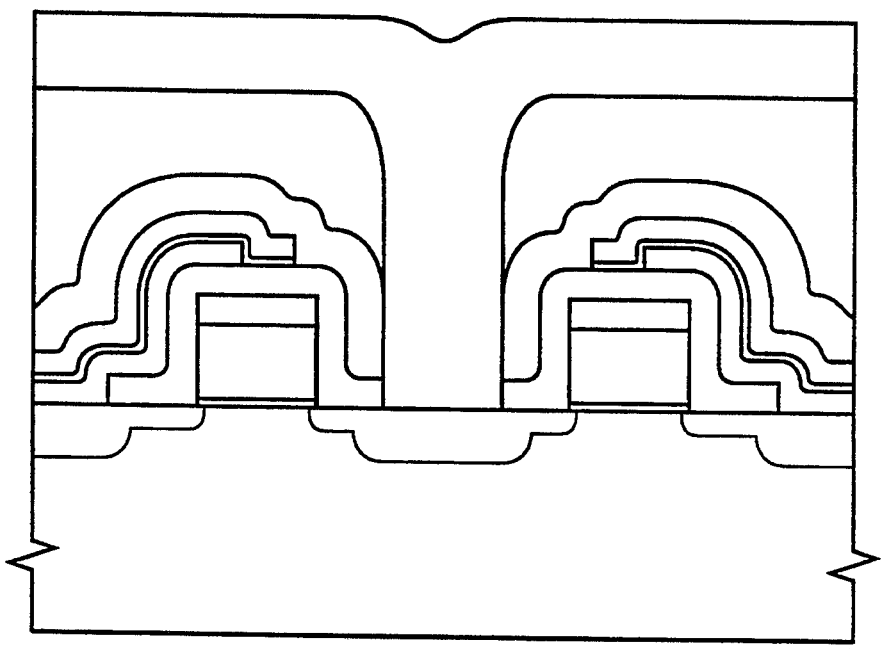
Figure 4B:
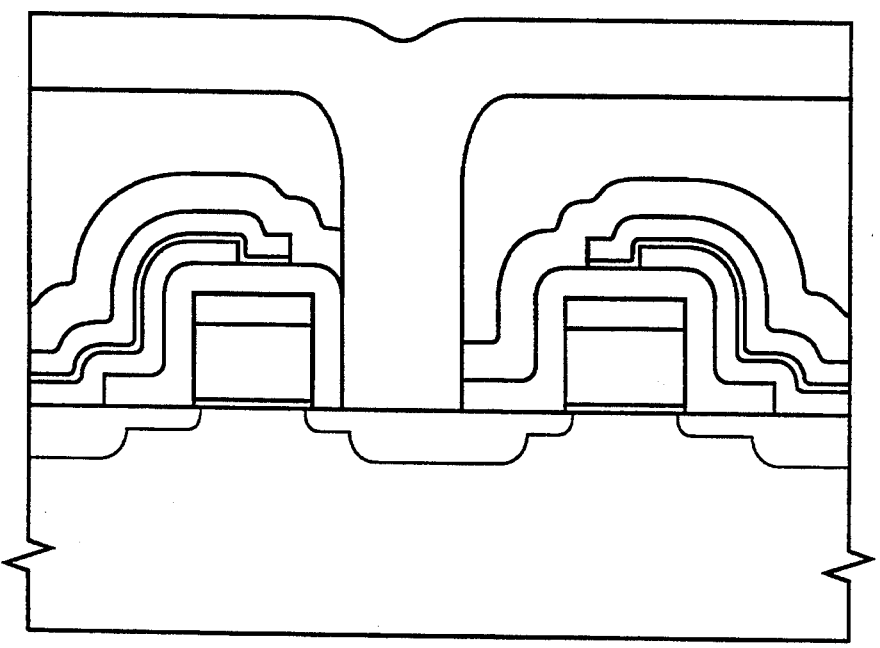
FIG. 4(b) is a cross sectional view of a misaligned semiconductor structure.
Figure 5:
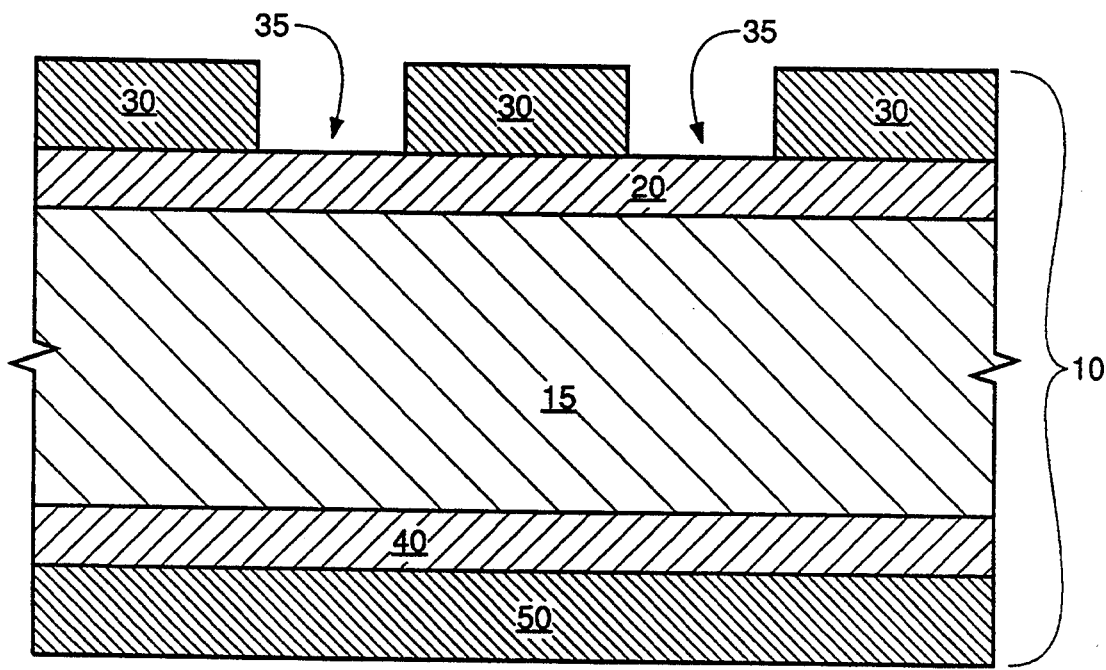
FIG. 5 is a cross sectional view of a multilayer heterostructure prior to undergoing the present inventive method.

Referring to FIG. 5, a multilayer semiconductor heterostructure 10 is illustrated prior to undergoing the present inventive method. The heterostructure 10 comprises a semiconductor substrate 15 and a plurality of layers positioned both subjacent and superjacent substrate 15. Semiconductor substrate 15 preferably comprises single crystal, polycrystalline, or amorphous silicon, though any other suitable material known in art can also be employed.

Positioned superjacent substrate 15 is a first upper layer 20. Superjacent first upper layer 20 is a second upper layer 30. Further, directly subjacent substrate 15 is a first lower layer 40, while subjacent first lower layer 40 is second lower layer 50. Layers 20, 30, 40 and 50 can be formed by single sided or double sided deposition techniques, such as Low Pressure Chemical Vapor Deposition ("LPCVD"), Plasma Deposition, or Rapid Thermal Chemical Vapor Deposition ("RTPCVD"). It, however, should be obvious to one of ordinary skill in the art that alternate approaches could be employed to form layers 20, 30, 40 and 50.

The chemical composition of layers 20, 30, 40 and 50 can be selected from a variety of materials relevant to fabricating semiconductor devices, such as silicon dioxide, silicon nitride, tungsten or any other material known to one of ordinary skill in the art. The compounds selected for forming layers 20, 30, 40 and 50 each having an impact as to the deformation of multilayer semiconductor heterostructure 10. This is primarily because the overall warp and bow of heterostructure 10 is directly dependent on the total stress on the structure. As such, the tensile or compressive stress associated with each compound selected in fabricating the semiconductor device is significant. Total stress can be expressed as the sum of both the total intrinsic stress and the total extrinsic stress on heterostructure 10. Total intrinsic stress is defined by properties of the compounds selected of each layer and the compatibility of each layer, with respect to the lattice structure. Further, total extrinsic stress can be characterized as the total thermal stress created by each layer on the heterostructure 10.

In a first embodiment of the present invention, second upper layer 30 comprises a pattern. The pattern can be formed by a variety of techniques known to one of ordinary skill in the art, and, as such, are not provided. By patterning second upper layer 30, portions of second upper layer 30 are removed, thereby exposing corresponding areas 35 of first upper layer 20. This structural configuration is in a state of non-equilibrium, and thus, suffers from further intrinsic stress. This additional stress, in light of other intrinsic stresses heretofore discussed, exacerbates the propensity of heterostructure 10 to deform in terms of warp and bow.

Figure 6:
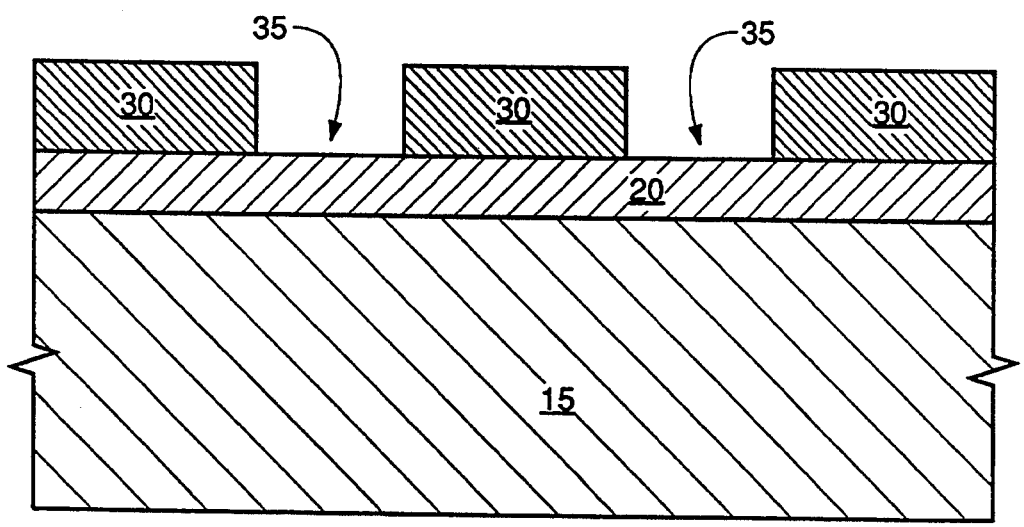
FIG. 6 is a cross sectional view of a multilayer heterostructure having undergone the present inventive method.

Referring to FIG. 6, multilayer heterostructure 10 is shown having undergone the first embodiment of the present invention. In order to compensate for the total stress on structure 10, first lower layer 40 and second lower layer 50 are removed, preferably after the multilayer heterostructure is heated. However, only second lower layer 50 may need to be removed, dependent on the total stress, thereby leaving first lower layer 40 subjacent substrate 15. Further, only a portion of second lower layer 50 may need to be removed. These issues, however, are dependent on the measured warp and bow of the structure. This entails examining the deformity of heterostructure 10 for warp and bow. Subsequently, the warp and bow measurements are compared with a warp and bow reference. This comparison ascertains whether the heterostructure falls within a predetermined tolerance. Once the measured results are compared, second upper layer 30 can be appropriately thinned, allowing a specific amount of layer 30 to be removed. It should further be obvious to one of ordinary skill in the art that these steps of examining the structure for deformities and comparing the structure with a predetermined tolerance could be utilized in any of the embodiments of the present invention described herein.

The removal of first lower layer 40 and second lower layer 50 can be achieved by a variety of methods known in the art. One such approach is by Chemical Mechanical Planarization. By this step, first lower layer 40 and second lower layer 50 are planarized. This planarizing step can comprise either chemical and/or mechanical means. Alternately, first lower layer 40 and second lower layer 50 can be removed by an etching step, such as dry etching, wet etching, plasma etching or other techniques known to one of ordinary skill in the art.

Nonetheless, it should also be obvious to one of ordinary skill in the art that a thin portion of second upper layer 30 can be removed utilizing the same techniques described herein, such as planarizing by chemical and/or mechanical means, dry etching, wet etching, plasma etching or other techniques known to one of ordinary skill in the art, to provide further support against the warp and bow of heterostructure 10. The thickness of the portion of second upper layer 30 removed is dependent on the nature and extent of the warp and bow of heterostructure 10. However, the amount removed must not ultimately effect the functionality of heterostructure 10. To achieve this end under this approach, heterostructure 10 is examined for warp and bow. Subsequently, the warp and bow measurements are compared with a warp and bow reference. This comparison ascertains whether the heterostructure falls within a predetermined tolerance. Once the measured results are compared, second upper layer 30 can be appropriately thinned, allowing a specific amount of layer 30 to be removed.

Figure 7:
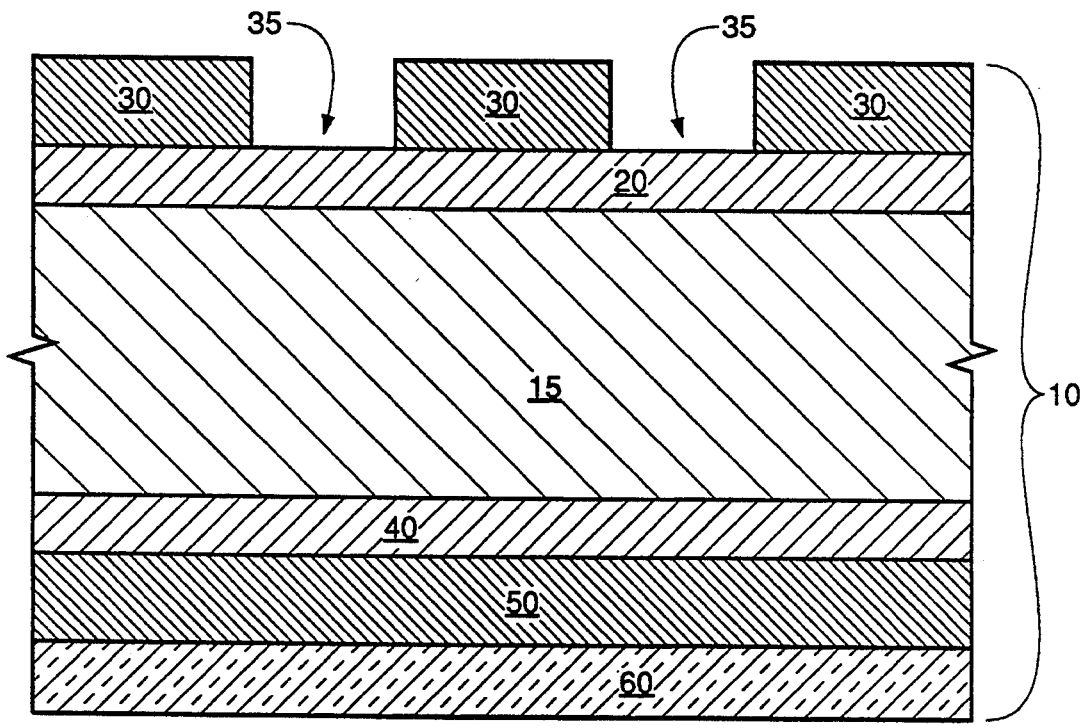
FIG. 7 is a cross sectional view of a multilayer heterostructure having undergone a first alternate embodiment of the present inventive method.

Referring to FIG. 7, multilayer heterostructure 10 is shown having undergone a second embodiment of the present invention. In order to compensate for the total stress on structure 10, a film 60 is formed subjacent second lower layer 50. Film 60 can comprise borophosphosilicate glass ("BPSG"), tetraethoxyorthosilicate ("TEOS"), wet silicon dioxide, or deposited silicon dioxide, though other compounds known to one of ordinary skill in the art may be employed with equal success.

As a first alternate approach to the second embodiment, in addition to adding film 60, a thin portion of second upper layer 30 is removed utilizing the same techniques described herein, such as planarizing by chemical and/or mechanical means, dry etching, wet etching, plasma etching or other techniques known to one of ordinary skill in the art. This step of removing a portion of second upper layer 30 is preferably after film 60 is formed subjacent second lower layer 50, though it can also be performed prior to forming film 60. The thickness of the portion of second upper layer 30 removed is dependent on the nature and extent of the warp and bow of heterostructure 10 in conjunction with the effect of the addition of film 60. However, the amount of second upper layer 30 that is removed must not ultimately effect the functionality of heterostructure 10. To this end, heterostructure 10, preferably having film 60, is examined for warp and bow. Subsequently, the warp and bow measurements are compared with a warp and bow reference. This comparison ascertains whether the heterostructure falls within a predetermined tolerance. Once the measured results are compared, second upper layer 30 can be appropriately thinned, allowing a specific amount of layer 30 to be removed.

As a second alternate approach to the second embodiment, film 60 is formed prior to a heating step and removed thereafter. Under this scheme, film 60 provides temporary support during the fabrication stages for which structure 10 is heated and thus vulnerable to plastic deformation. As such, once it has performed its function as a stabilizer, it is removed. The removal of film 60 can be achieved by chemical and/or mechanical planarization, dry etching, wet etching, plasma etching or other techniques known to one of ordinary skill in the art.

Figure 8:
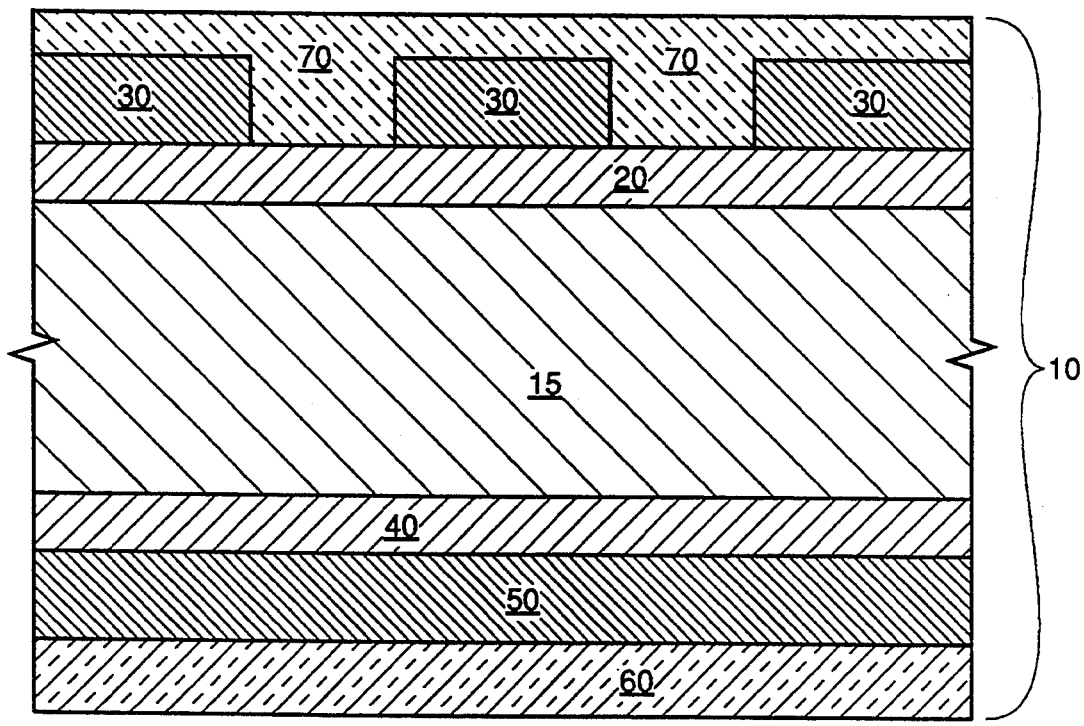
FIG. 8 is a cross sectional view of a multilayer heterostructure having undergone a second alternate embodiment of the present inventive method.

Referring to FIG. 8, multilayer heterostructure 10 is shown having undergone a third embodiment of the present invention. In order to compensate for the total stress on structure 10, a coating 70 is formed superjacent second upper layer 30. Coating 70 can comprise borophosphosilicate glass ("BPSG"), tetraethoxyorthosilicate ("TEOS"), wet silicon dioxide, or deposited silicon dioxide, though other compounds known to one of ordinary skill in the art may be employed with equal success. Coating 70 can formed independently of film 60 or in conjunction with formation of film 60. The determination of approach employed is dependent on the measured deformity in comparison with the predetermined tolerance.

Further, in an alternate approach to the third embodiment, coating 70 is formed prior to a heating step and removed thereafter. Under this scheme, coating 70 provides temporary support during the fabrication stages for which structure 10 is heated and thus vulnerable to plastic deformation. As such, once it has performed its function as a stabilizer, it is removed. The removal of coating 70 can be achieved by chemical and/or mechanical planarization, dry etching, wet etching, plasma etching or other techniques known to one of ordinary skill in the art.

While the particular invention has been described with reference to illustrative embodiments, this description is not meant to be construed in a limiting sense. It is understood that although the present invention has been described in a preferred embodiment, various modifications of the illustrative embodiments, as well as additional embodiments of the invention, will be apparent to persons skilled in the art upon reference to this description without departing from the spirit of the invention, as recited in the claims appended hereto. It is therefore contemplated that the appended claims will cover any such modifications or embodiments as fall within the true scope of the invention.

All of the U.S. Patents cited herein are hereby incorporated by reference as if set forth in their entirety.

What is claimed is:

1. A method for fabricating semiconductors, comprising the steps of:

depositing at least one layer superjacent and at least one layer subjacent a single semiconductor substrate, thereby causing a deformity in said substrate, said deformity comprising at least one of a warp and a bow, said layers being deposited by at least one of Low Pressure Chemical Vapor Deposition ("LPCVD"), Plasma Deposition, and Rapid Thermal Chemical Vapor Deposition ("RTPCVD");

thereafter, heating said deformed substrate; and removing said at least one layer subjacent said substrate, thereby reducing said deformity.

2. A method for fabricating semiconductors, according to claim 1, wherein said deposition comprises at least one of single sided and double sided deposition.

3. A method for fabricating semiconductors, according to claim 1, wherein said removing comprises the step of:

planarizing said at least one layer subjcent said substrate, said planarizing comprising at least one of chemical and mechanical means.

4. A method for fabricating semiconductors, according to claim 1, wherein said removing comprises the step of:
etching at least one of said at least one layer subjacent said substrate, said etching comprising at least one of dry etching, wet etching, and plasma etching.

5. A method for fabricating semiconductors having substantially reduced deformities, comprising the steps of:
layering a single semiconductor substrate, wherein said layering comprises deposition by at least one of Low Pressure Chemical Vapor Deposition ("LPCVD"), Plasma Deposition, and Rapid Thermal Chemical Vapor Deposition ("RTPCVD"), said substrate being deformed by said layering said deformity comprising at least one of warp and bow;
forming a film subjacent said deformed substrate; and
heating said film, thereby reducing said at least one of warp and bow.

6. A method for fabricating semiconductors, according to claim 5, wherein said deposition comprises at least one of single sided and double sided deposition.

7. A method for fabricating semiconductors, according to claim 6, wherein said film comprises at least one of borophosphosilicate glass ("BPSG"), tetraethoxyorthosilicate ("TEOS"), wet silicon dioxide and deposited silicon dioxide.

8. A method for fabricating semiconductors, according to claim 5, further comprising the step of:
removing a portion of one of said layers.

9. A method for fabricating semiconductors, according to claim 8, wherein said removing comprises the step of:
planarizing one of said layers by at least one of chemical and mechanical means.

10. A method for fabricating semiconductors, according to claim 8, wherein said removing comprises the step of:
etching a portion of one of said layers, said etching comprising at least one of dry etching, wet etching, and plasma etching.

11. A method for fabricating semiconductors, according to claim 5, further comprising the step of:
removing a portion of another of said layers.

12. A method for fabricating semiconductors, according to claim 11, wherein said removing comprises the step of:
planarizing another of said layers, said planarizing comprising at least one of chemical and mechanical means.

13. A method for fabricating semiconductors, according to claim 11, wherein said removing comprises the step of:
etching a portion of another of said layers, said etching comprising at least one of dry etching, wet etching, and plasma etching.

14. A method for reducing the effects of warp and bow in fabricating semiconductors, comprising the steps of:
providing a single semiconductor substrate having a deformity, said substrate comprising at least one layer having a first thickness superjacent said deformed substrate and at least one layer having a second thickness subjacent said deformed substrate, said layers being deposited by at least one of Low Pressure Chemical Vapor Deposition ("LPCVD"), Plasma Deposition, and Rapid Thermal Chemical Vapor Deposition ("RTPCVD");
examining said deformed substrate for warp and bow;
comparing said warp and bow of said deformed substrate with a reference; and
reducing at least one of said thicknesses in response to said comparing, thereby matching said warp and bow to said reference.

15. A method for fabricating semiconductors, according to claim 14, wherein said reducing comprises the step of:
planarizing at least one of said layers, said planarizing comprising at least one of chemical and mechanical means.

16. A method for fabricating semiconductors, according to claim 14, wherein said layers are formed by deposition, said deposition being at least one of single sided and double sided deposition.

17. A method for fabricating semiconductors, according to claim 14, wherein a film is formed superjacent said layer superjacent said substrate prior to said reducing said at least one of said thicknesses, said film being heated and subsequently removed.

18. A method for fabricating semiconductors, according to claim 17, wherein said film is removed by at least one of chemical mechanical planarization, dry etch, wet etch and plasma etch.

19. A method for fabricating semiconductors, according to claim 14, wherein a film is formed subjacent said layer subjacent said substrate prior to said reducing said at least one of said thicknesses, said film being heated and subsequently removed.

20. A method for fabricating semiconductors, according to claim 19, wherein said film is removed by at least one of chemical mechanical planarization, dry etch, wet etch and plasma etch.

* * * * *